US012794487B1

(12) United States Patent
Li et al.

(10) Patent No.: US 12,794,487 B1
(45) Date of Patent: Nov. 10, 2026

(54) CURRENT SOURCE CIRCUITRY WITH TOLERANCE TO PVT VARIATIONS

(71) Applicant: Marvell Asia Pte Ltd, Singapore (SG)

(72) Inventors: Zhipeng Li, Fremont, CA (US); Kuan Ming Lu, Hsinchu City (TW); Zhendong Guo, San Jose, CA (US)

(73) Assignee: MARVELL ASIA PTE LTD, Singapore (SG)

( * ) Notice: Subject to any disclaimer, the term of this patent is extended or adjusted under 35 U.S.C. 154(b) by 101 days.

(21) Appl. No.: 19/015,264

(22) Filed: Jan. 9, 2025

Related U.S. Application Data

(60) Provisional application No. 63/619,002, filed on Jan. 9, 2024.

(51) Int. Cl.

| | |
|---|---|
| ***H03M 1/66*** | (2006.01) |
| ***H02M 1/00*** | (2007.01) |
| ***H02M 3/155*** | (2006.01) |

(52) U.S. Cl.
CPC .......... *H03M 1/66* (2013.01); *H02M 1/0003* (2021.05); *H02M 3/155* (2013.01)

(58) Field of Classification Search
CPC ....... H03M 1/66; H02M 1/0003; H02M 3/155
USPC .......................................... 341/136, 144
See application file for complete search history.

(56) References Cited

U.S. PATENT DOCUMENTS 11,728,822 B2 * 8/2023 Mehdizad Taleie .. H03M 1/785 341/144
11,990,916 B2 * 5/2024 Agrawal ............ H03M 1/0863

* cited by examiner

*Primary Examiner* — Khai M Nguyen

(57) ABSTRACT

A precision current-mode digital-to-analog converter (DAC) with tolerance to process, voltage, and temperature (PVT) variations includes a first transistor including a first gate terminal configured to receive a digital input and to control magnitude of an output current based on the digital input, and a second transistor including a second gate terminal configured to receive a clock signal via a coupling capacitor, and a DC voltage via a coupling resistor, a magnitude of the DC voltage being set based on the PVT variations, the second transistor being configured to further control the magnitude of the output current based on the DC voltage, where the first transistor and the second transistor are coupled in series such that the output current flows through the first transistor and the second transistor.

21 Claims, 3 Drawing Sheets

CURRENT SOURCE CIRCUITRY WITH TOLERANCE TO PVT VARIATIONS

CROSS REFERENCE TO RELATED APPLICATION

This disclosure claims the benefit of copending, commonly-assigned U.S. Provisional Patent Application No. 63/619,002, filed Jan. 9, 2024, which is hereby incorporated by reference herein in its entirety.

FIELD OF USE

This disclosure relates to current source circuitry. More particularly, this disclosure relates to precision current source circuitry with tolerance to process, voltage, and temperature (PVT) variations. In some implementations, the precision current source circuitry of this disclosure is provided as a component of a precision current-mode digital-to-analog converter (DAC) with tolerance to PVT variations.

BACKGROUND

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted to be prior art against the subject matter of the present disclosure.

Current source circuitry may be used to generate a desired current flow. In some implementations, current source circuitry may be used as part of a current-mode DAC to generate the analog output current of the current-mode DAC. Such current source circuitry should generate the analog output current based on a digital input, where a precision of the analog output current magnitude corresponds to a least significant bit (LSB) of the digital input. The current-mode DAC may have an output resistance that is greater than the input resistance of the circuit that is driven by the current-mode DAC, which can affect the precision of the current source circuitry driving the current-mode DAC.

SUMMARY

In accordance with implementations of the subject matter of this disclosure, a precision current-mode digital-to-analog converter (DAC) with tolerance to process, voltage, and temperature (PVT) variations includes a first transistor including a first gate terminal configured to receive a digital input and to control magnitude of an output current based on the digital input, and a second transistor including a second gate terminal configured to receive a clock signal via a coupling capacitor and a DC voltage via a coupling resistor, a magnitude of the DC voltage being set based on the PVT variations, the second transistor being configured to further control the magnitude of the output current based on the DC voltage, where the first transistor and the second transistor are coupled in series such that the output current flows through the first transistor and the second transistor.

In a first implementation of such a current-mode DAC, the coupling capacitor may be configured to remove a direct current (DC) component of the clock signal and to transmit, to the second gate terminal, an alternating-current (AC) component of the clock signal.

In a second implementation of such a current-mode DAC, the coupling resistor may be configured to set a gate-source voltage of the second transistor.

A third implementation of such a current-mode DAC may further include a reference current circuit and control logic configured to control the magnitude of the DC voltage based on a reference current of the reference current circuit.

According to a first aspect of that third implementation, the reference current circuit may include a third transistor and a fourth transistor, the third transistor may be a scaled-down replica of the first transistor, and the fourth transistor may be a scaled-down replica of the second transistor.

In a first instance of that first aspect, the third transistor may include a third gate terminal coupled to the first gate terminal, and the fourth transistor may include a fourth gate terminal coupled to the digital input.

According to a second aspect of that third implementation, the current-mode DAC may further include a comparator coupled to the reference current circuit, where the control logic controls the magnitude of the DC voltage based on an output of the comparator.

In a first instance of that second aspect, inputs to the comparator may include a reference voltage and a signal based on the reference current.

In accordance with implementations of the subject matter of this disclosure, a method of operating precision current source circuitry with tolerance to process, voltage, and temperature (PVT) variations includes receiving, at a first transistor including a first gate terminal, a digital input, where the first transistor drives an output current of the current source circuitry based on the digital input, and driving, using a second transistor comprising a second gate terminal, the output current based on a clock signal that is coupled to the second gate terminal via a coupling capacitor and a DC voltage that is coupled to the second gate terminal via a coupling resistor, a magnitude of the DC voltage being set based on the PVT variations, where the output current flows through the first transistor and the second transistor.

A first implementation of such a method may further include removing, using the coupling capacitor, a direct current (DC) component of the clock signal and transmitting, to the second gate terminal, an alternating-current (AC) component of the clock signal.

A second implementation of such a method may further include setting, using the coupling resistor, a gate-source voltage of the second transistor.

A third implementation of such a method may further include controlling, using control logic, a magnitude of the DC voltage based on a reference current of the reference current circuit.

A first aspect of that third implementation may further include generating, using a third transistor and a fourth transistor of the reference current circuit, the reference current, where the third transistor may be a scaled-down replica of the first transistor, and the fourth transistor may be a scaled-down replica of the second transistor.

In a first instance of that first aspect, the third transistor may include a third gate terminal and the fourth transistor may include a fourth gate terminal coupled to the digital input, and the method may further include coupling the third gate terminal to the first gate terminal and coupling the fourth gate terminal to the digital input.

A second aspect of that third implementation may further include coupling a comparator to the reference current circuit, where controlling the magnitude of the DC voltage based on the reference current may include controlling the magnitude of the DC voltage based on an output of the comparator.

A first instance of that second aspect may further include providing, as inputs to the comparator, a reference voltage and a signal based on the reference current.

In accordance with implementations of the subject matter of this disclosure, precision current source circuitry with tolerance to process, voltage, and temperature (PVT) variations includes a first transistor including a first gate terminal configured to receive a digital input and to control magnitude of an output current based on the digital input, and a second transistor including a second gate terminal configured to receive a clock signal via a coupling capacitor and a DC voltage via a coupling resistor, a magnitude of the DC voltage being set based on the PVT variations, the second transistor being configured to further control the magnitude of the output current based on the DC voltage, where the first transistor and the second transistor are coupled in series such that the output current flows through the first transistor and the second transistor.

A first implementation of such current source circuitry may further include a reference current circuit, and control logic configured to control the magnitude of the DC voltage based on a reference current of the reference current circuit.

A first aspect of that first implementation may further include a comparator coupled to the reference current circuit, where the control logic controls the DC voltage based on an output of the comparator.

In a first instance of that first aspect, inputs to the comparator may include a reference voltage and a signal based on the reference current.

In accordance with implementations of the subject matter of this disclosure, a method of manufacturing a precision current-mode digital-to-analog converter (DAC) with tolerance to process, volage, and temperature (PVT) variations includes arranging a first transistor and a second transistor in an output current flow path of the DAC, arranging a first gate terminal of the first transistor to receive a digital input of the DAC, the digital input controlling magnitude of an output current in the output current path, arranging a second gate terminal of the second transistor to receive a clock signal via a coupling capacitor, and arranging the second gate terminal of the second transistor to further receive, via a coupling resistor, a DC voltage having a magnitude to be set based on the PVT variations, the second transistor arranged such that the DC voltage further controls the magnitude of the output current.

BRIEF DESCRIPTION OF THE DRAWINGS

Further features of the disclosure, its nature and various advantages, will be apparent upon consideration of the following detailed description, taken in conjunction with the accompanying drawings, in which like reference characters refer to like parts throughout, and in which.

DETAILED DESCRIPTION

Figure 1:
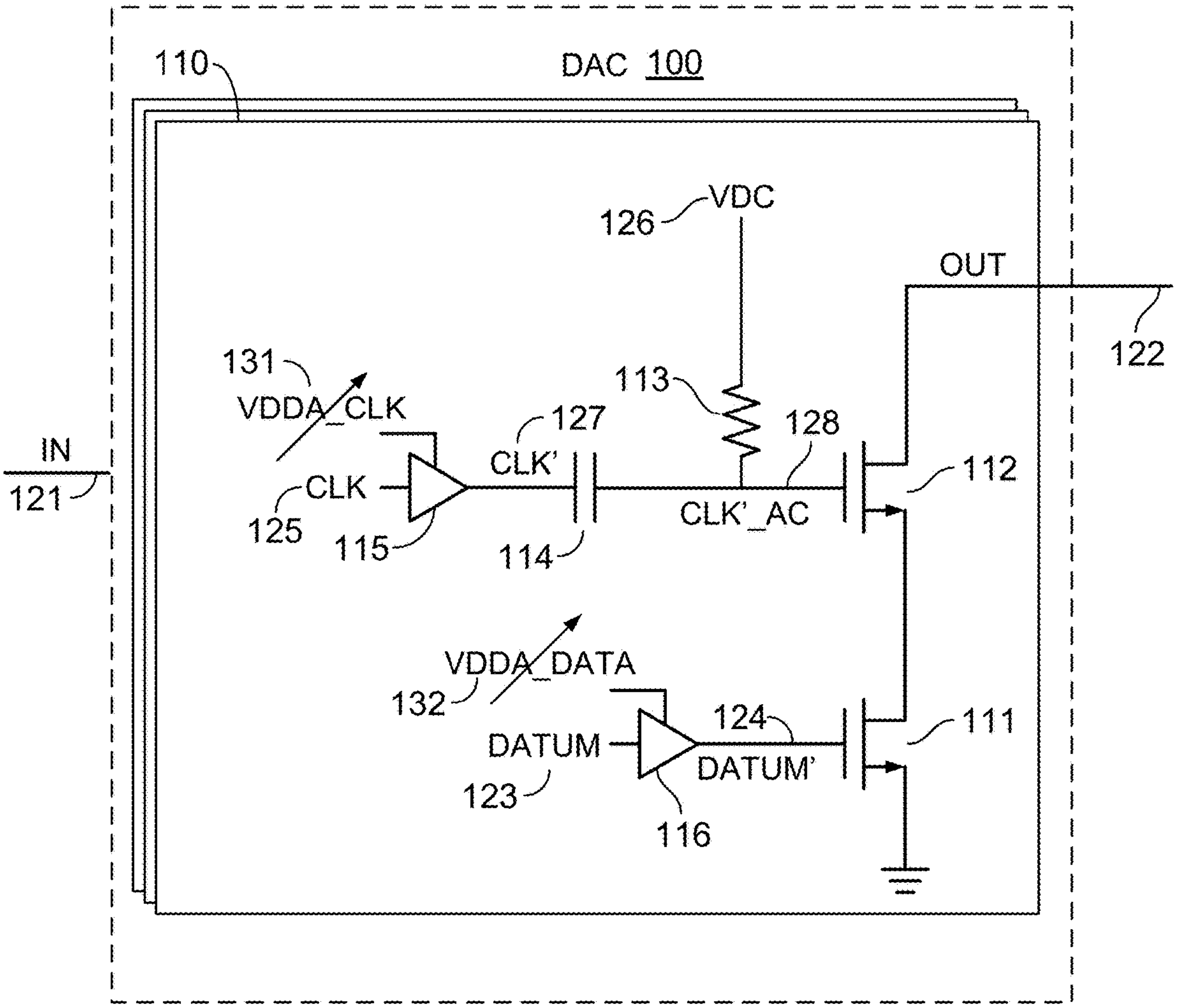
FIG. 1 is a circuit diagram of a current-mode DAC including current source circuitry with PVT tolerance, in accordance with implementations of the subject matter of this disclosure.

As mentioned above, current source circuitry may be used to generate a current flow. The output current generated by the current source circuitry should be precise (i.e., the magnitude of the output current should be sufficiently close to the intended current magnitude). In particular, when implemented to generate the output current of a current-mode DAC, current source circuitry should generate an output current with a precision that corresponds to an LSB of a digital input to the DAC.

As the precision (e.g., number of bits) of a current-mode DAC increases, the precision (and, by extension, robustness to PVT variations) of the output current source circuitry should increase. However, this output current source precision is constrained by device miniaturization because smaller transistors may be more susceptible to PVT variations and may afford less headroom (e.g., causing there to be a smaller difference between a minimum output current and a maximum output current of the current source circuitry). For example, an 8-bit current-mode DAC may be configured to have an output current range of ~10 mA, meaning that each one of the 256 possible values of the 8-bit DAC may be distinguished by a mere 40 μA difference in the output current magnitude.

While current-mode logic DAC units may be implemented with current source circuitry that generates the output current using two transistors in series, this base architecture may not be sufficiently precise (e.g., for use in a high-precision DAC) due to PVT variations.

In accordance with implementations of the subject matter of this disclosure, precision current source circuitry is provided with tolerance to PVT variations. The precision current source circuitry is driven by two transistors, one of which is controlled by a digital input (e.g., which may represent the data that is to be converted by the DAC) that generally sets the output level of the current source circuitry, and the other of which is controlled by a tunable bias voltage (e.g., that is set by control logic based on calibration circuitry to compensate for PVT variations) that finely tunes the output level for accuracy. For example, while the two transistors described in this paragraph may be stacked in series with the output current of the current source circuitry terminating by flowing through the two transistors, as described above, in accordance with the subject matter of this disclosure, the top one of those two transistors is driven by an adjustable bias voltage that can be tuned to provide tolerance to PVT variations and precision in the output current.

In some implementations, the digital input to the first transistor coarsely scales the output of the current source circuitry. For example, if the current source circuitry is implemented within a current-mode DAC, then the first transistor may be driven by a digital input which is to be converted to an analog output. The tunable input to the second transistor finely scales the output of the current source circuitry. For example, the tunable input may be a tunable DC bias voltage that is adjustable based on temperature, supply voltage, device characteristics, or any combination thereof, to provide PVT tolerance. This tunable DC bias voltage may be tuned by control logic coupled to calibration circuitry (e.g., a reference current circuit).

The gate terminal of the aforementioned second transistor is coupled to a node between a clock signal and the DC bias voltage. A coupling capacitor couples the clock signal to that node, and the coupling capacitor may be configured to transmit an AC component of the clock signal to the node. A coupling resistor couples the DC bias voltage to that node, and the coupling resistor may be configured to set, along with the DC bias voltage, a gate-source voltage drop across the aforementioned second transistor.

The output current magnitude may be set according to the gate-source voltage and drain-source voltage across the aforementioned first transistor. Because the second transistor is stacked atop the first, the drain-source voltage of the first transistor may be set according to the gate-source voltage across the aforementioned second transistor based on the clock signal, the DC bias voltage, the coupling capacitor, and the coupling resistor.

In some implementations, a reference current circuit is coupled to the current source circuitry to calibrate the output current magnitude of the current source circuitry across PVT variations. For example, because the magnitude of the reference current may depend on PVT variations, control logic may adjust the DC bias voltage in a feedback loop after comparing an actual level of a reference signal to an expected level of the reference signal.

As mentioned, implementations of the subject matter of this disclosure are included, but not limited to, using the aforementioned current source circuitry to generate the output of a current-mode DAC. In other words, the aforementioned current source circuitry (and, optionally, the aforementioned reference current circuit and control logic) may be included within a current-mode DAC to generate an analog output (i.e., a current magnitude) that corresponds to a digital input.

Figure 2:
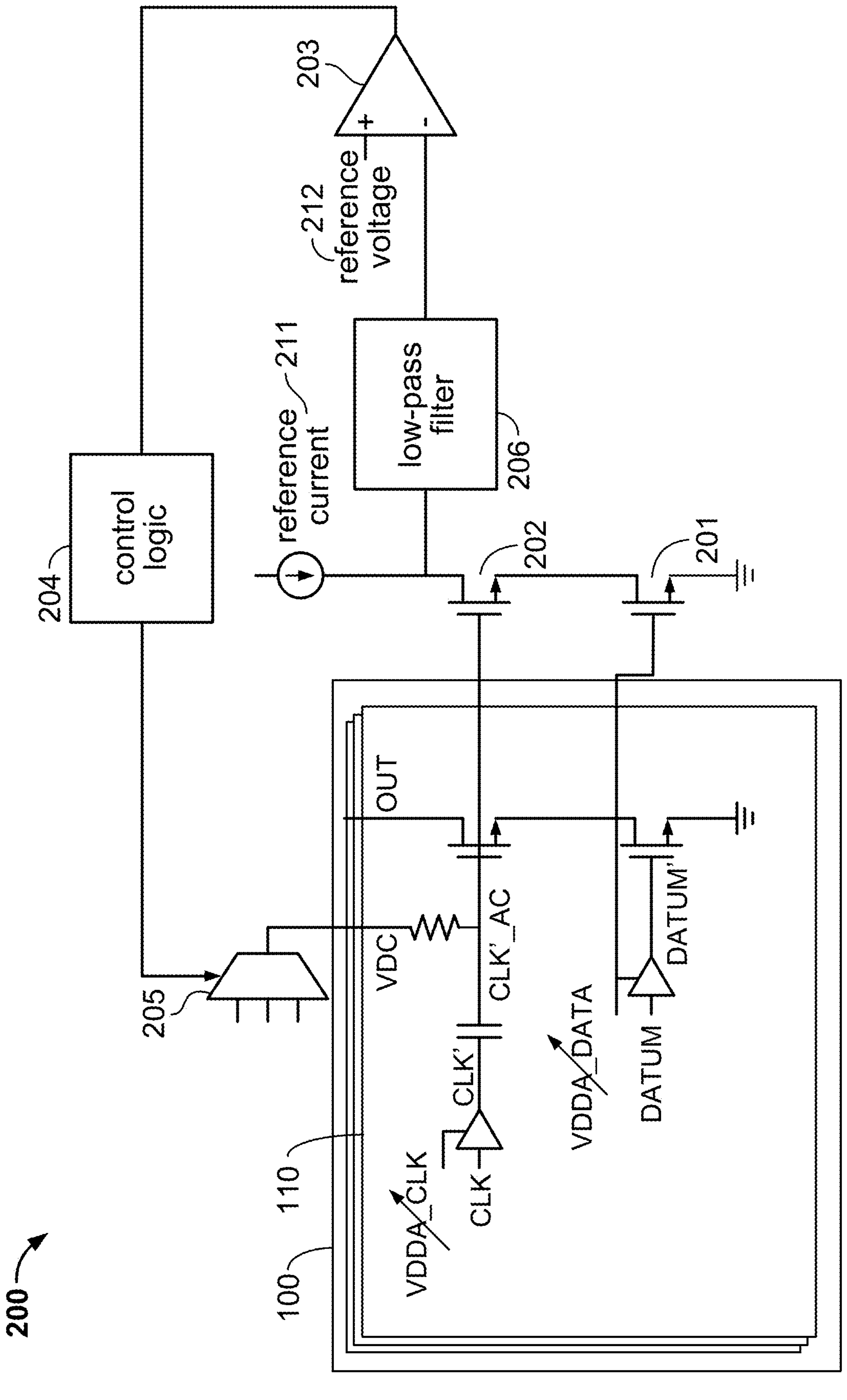
FIG. 2 is a circuit diagram of current source circuitry with PVT tolerance, where the current source circuitry is coupled to reference current circuitry and control logic, in accordance with implementations of the subject matter of this disclosure.
Figure 3:
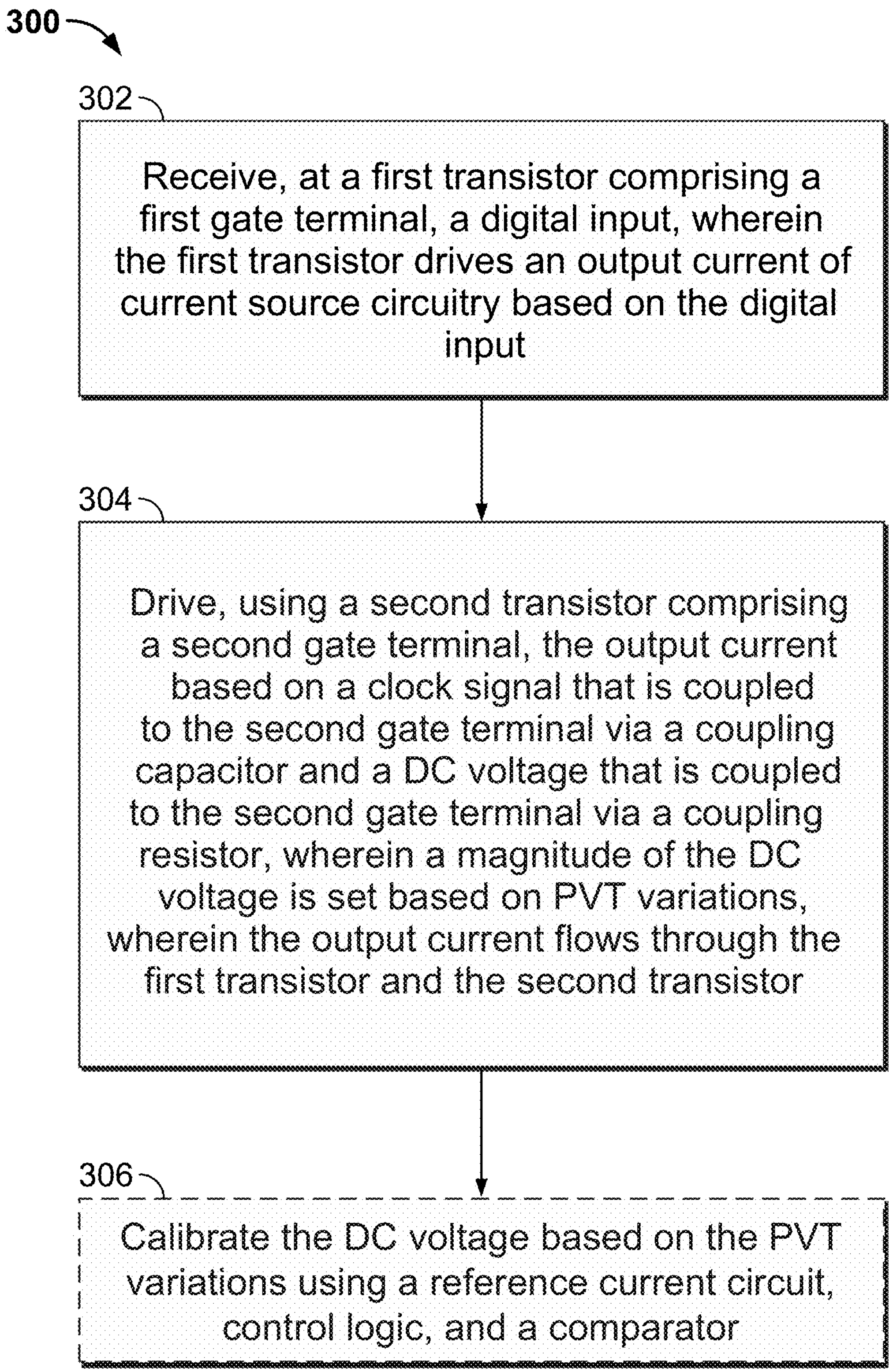
FIG. 3 is a flow diagram of an illustrative method for operating current source circuitry with PVT tolerance, in accordance with implementations of the subject matter of this disclosure.

The subject matter of this disclosure may be better understood by reference to FIGS. 1-3.

FIG. 1 shows a circuit diagram of current source circuitry 110 with PVT tolerance, including its possible inclusion within DAC 100, in accordance with implementations of the subject matter of this disclosure. As shown, when implemented within DAC 100, there may be multiple iterations of current source circuitry 110, e.g., the number of iterations corresponding to the number of bits of DAC 100. Each unit of current source circuitry 110 includes first transistor 111 and second transistor 112, which are stacked in series (e.g., a single current, which is output current 122, flows through both transistors). Inputs 121 to DAC 100 (which are lumped together in FIG. 1 for ease of illustration) may include a clock (e.g., clock 125), multi-bit input data (e.g., where datum 123 may represent any bit of the multi-bit input data), and a bias voltage (e.g., DC bias voltage 126). For example, if DAC 100 is an eight-bit DAC, then the multi-bit input data may include eight bits, there may be eight iterations of current source circuitry 110, and each of those eight iterations may receive, as datum 123, one of those eight bits.

First transistor 111 drives output current 122 based on the voltage at gate terminal 124 (e.g., datum'). Datum 123 is a digital input providing one bit of the multi-bit data that is to be converted by DAC 100. "VDDA DATA" (which is subsequently referred to as data buffer supply voltage 132) may denote a data buffer supply voltage with a variable magnitude, as indicated by the diagonal arrow. The data buffer supply voltage 132 powers data buffer 116 (e.g., an inverter, stages of cascaded inverters, or any other suitable buffer), which processes datum 123 into buffered datum' 124, which is received at the first transistor. Data buffer supply voltage 132 may, e.g., be tuned based on a transient response profile of data buffer 116, a desired amount of power consumption, a voltage level of the multi-bit data provided as part of inputs 121, a timing of clock 125, or any combination thereof.

When current source circuitry 110 is implemented within DAC 100, output current 122 may be provided as an analog output current with a magnitude that is determined by the voltage level of the multi-bit data provided as part of inputs 121.

Second transistor 112 further drives output current 122 based on the voltage at gate terminal 128. As shown, "CLK' AC" may denote the AC component of a buffered clock signal (e.g., CLK' 127), where the DC component of the buffered clock signal may be removed by coupling capacitor 114. Buffered clock signal 127 is the output of clock buffer 115 (e.g., an inverter, stages of cascaded inverters, or any other suitable buffer), which processes clock 125. "VDDA CLK" (which is subsequently referred to as clock buffer supply voltage 131) may denote a clock buffer supply voltage with a variable magnitude, as indicated by the diagonal arrow. Clock buffer supply voltage 131 may, e.g., be tuned based on a transient response profile of clock buffer 115, a desired amount of power consumption, a voltage level of clock 125, a timing of clock 125, or any combination thereof. There is a current flow path between CLK' 127 and DC bias voltage 126 ("VDC"). Coupling resistor 113 is included between gate terminal 128 and VDC 126. Coupling resistor 113 may provide the DC component of DC bias voltage 126 to gate terminal 128, with coupling capacitor 114 providing the AC component of buffered clock signal 127 to gate terminal 128; together, that DC component and that AC component set the gate-source voltage of second transistor 112. The resistance of coupling resistor 113, the capacitance of coupling capacitor 114, or both, may be set according to a minimum high-pass cutoff frequency (e.g., based on a timing of clock 125) for transmitting buffered clock signal 127.

DC bias voltage 126 is provided as an aspect of current source circuitry 110 that can be tuned (e.g., in response to PVT variations) to provide accuracy of output current 122, as well as tolerance to PVT variations. For example, DC bias voltage 126 may be tuned using control logic 204, a reference current circuit, or a combination thereof (e.g., as shown and described in connection with FIG. 2).

When implemented within DAC 100, multiple iterations of current source circuitry 110 may share a single instance of clock buffer 115, a single instance of coupling capacitor 114, and a single instance of coupling resistor 113. In some implementations, each iteration of current source circuitry 110 may include a respective data buffer 116 that is configured based on the corresponding datum 123.

FIG. 2 shows broader circuitry 200 that includes DAC 100 and auxiliary circuitry including control logic 204, and a reference current circuit, in accordance with implementations of the subject matter of this disclosure. In some implementations, DAC 100 includes all of the broader circuitry 200. Broader circuitry 200 includes, in addition to current source circuitry 110, control logic 204, multiplexer 205, and the reference current circuit including third transistor 201, fourth transistor 202, reference current, low-pass filter 206, and comparator 203.

In some implementations, third transistor 201 is a scaled-down replica (e.g., $1/64^{th}$ the size) of first transistor 111, and fourth transistor 202 is a scaled-down replica (e.g., $1/64^{th}$ the size) of second transistor 112. The gate terminal of third transistor 201 is coupled to data buffer supply voltage 132, and the gate terminal of fourth transistor 202 is coupled to gate terminal 128 of second transistor 112. Based on third transistor 201 and fourth transistor 202 having inputs that respectively correspond to those of first transistor 111 and second transistor 112, reference current 211 corresponds to output current 122. For example, reference current 211 may be $1/64^{th}$ the magnitude of output current 122. By implementing third transistor 201 and fourth transistor 202 as scaled-down replicas of first transistor 111 and second transistor 112, the reference current circuit can be implemented with less allocated space and operated with less energy consumption.

Reference current 211 is processed at low-pass filter 206 (e.g., to convert the current to a voltage, and optionally to remove high-frequency noise). The output of low-pass filter 206 is provided as a first input (i.e., a signal based on reference current 211) to comparator 203. Reference voltage 212 is supplied as a second input to comparator 203. Reference voltage 212 may be a calibration voltage, e.g., with a magnitude that is equal to the DC component of output current 122. Reference voltage 212 may be set for a range of possible magnitudes of output current 122, and may be further set based on PVT variations. For example, reference voltage 212 may be configured to change in response to a temperature of DAC 100, a supply voltage of broader circuitry 200, or a combination thereof.

Comparator 203 compares the voltage which is output from low-pass filter 206 based on reference current 211 to reference voltage 212. The output of comparator 203 is received at control logic 204, which can control VDC 126 via a control signal processed at multiplexer 205 based on the output of comparator 203. Accordingly, as explained, output current 122 and reference current 211 may be adjusted until comparator 203 indicates sufficient alignment between reference voltage 212 and the output of low-pass filter 206, or until comparator 203 indicates that a particular one of reference voltage 212 and the voltage at the output of low-pass filter 206 is greater than the other (e.g., depending on the configuration of control logic 204, current source 110 may be considered to have been calibrated when reference voltage 212 is greater than the voltage at the output of low-pass filter 206, or when reference voltage 212 is less than the voltage at the output of low-pass filter 206). This indication would mean that output current 122 is properly calibrated; that is, current-mode DAC 100 would generate the correct magnitude of output current 122 based on the digital input 121.

FIG. 3 is a flow diagram of a method 300 for operating precision current source circuitry with tolerance to PVT variations, in accordance with implementations of the subject matter of this disclosure. In some implementations, method 300 may include the use of current source circuitry 110, with or without the other components of broader circuitry 200.

At 302, a digital input is received at a first transistor including a first gate terminal. The first transistor drives an output of current source circuitry based on the digital input.

At 304, the output current is driven using a second transistor including a second gate terminal. The second transistor drives the output current based on a clock signal that is coupled to the second gate terminal via a coupling capacitor, and based on a DC voltage that is coupled to the second gate terminal via a coupling resistor, where the DC voltage is set based on PVT variations. The output current flows through the first transistor and the second transistor.

In some implementations, method 300 is performed as part of operating a precision current-mode DAC with tolerance to PVT variations based on the precision current-mode DAC including the precision current source circuitry with tolerance to PVT variations. Accordingly, the digital input may be the digital DAC input, and the output current may be the analog DAC output. In some implementations, setting the magnitude of the DC voltage based on PVT variations may provide a variance of the output current that is less than the current range of an LSB of the precision current-mode DAC.

Method 300 may also include the optional operations at 306 to calibrate the DC voltage based on the PVT variations using a reference current circuit, control logic, and a comparator (e.g., as shown in FIG. 2). The reference current circuit may include third and fourth transistors as scaled-down replicas of the first and second transistors, respectively. That third transistor may be driven by the same input as that first transistor, and that fourth transistor may be driven by an input corresponding to that of the second transistor (e.g., by a supply voltage received at circuitry which buffers the input to the second transistor, or possibly by the input to the second transistor). In some implementations, the control logic operates based on the output of the comparator, which indicates which one of a reference voltage or a voltage based on the reference current is greater. In some implementations, the comparator indicates an alignment between the reference voltage and a voltage based on the reference current (e.g., based on more slowly generating an output when there is sufficient alignment). The control logic may set the DC voltage (e.g., by selecting an output of a multiplexer) based on the output of the comparator.

In connection with the operations at 306, method 300 may include receiving the digital input at 302, determining that the output current at 304 is not sufficiently precise (e.g., based on an output of the comparator, as processed by the control logic), calibrating the DC voltage at 306, and then re-processing the output current (e.g., with sufficient precision) by repeating the operations at 302 and 304.

Thus it is seen that a precision current-mode DAC with tolerance to PVT variations, precision current source circuitry with tolerance to PVT variations, a method for operating precision current source circuitry with tolerance to PVT variations, and a method for manufacturing a precision current-mode DAC with tolerance to PVT variations, have been provided.

As used herein and in the claims which follow, the construction "one of A and B" shall mean "A or B."

It is noted that the foregoing is only illustrative of the principles of the invention, and that the invention can be practiced by other than the described implementations, which are presented for purposes of illustration and not of limitation, and the present invention is limited only by the claims which follow.

What is claimed is:

1. A precision current-mode digital-to-analog converter (DAC) with tolerance to process, voltage, and temperature (PVT) variations, the DAC comprising:

a first transistor comprising a first gate terminal configured to receive a digital input and to control magnitude of an output current based on the digital input; and a second transistor comprising a second gate terminal configured to receive:

a clock signal via a coupling capacitor, and a DC voltage via a coupling resistor, a magnitude of the DC voltage to be set based on the PVT variations, the second transistor being configured to further control the magnitude of the output current based on the DC voltage; wherein:

the first transistor and the second transistor are coupled in series such that the output current flows through the first transistor and the second transistor.

2. The current-mode DAC of claim 1, wherein the coupling capacitor is configured to remove a direct current (DC) component of the clock signal and to transmit, to the second gate terminal, an alternating-current (AC) component of the clock signal.

3. The current-mode DAC of claim 1, wherein the coupling resistor is configured to set, along with the coupling capacitor, a high-pass cutoff frequency for transmitting the clock signal.

4. The current-mode DAC of claim 1, further comprising:

a reference current circuit; and control logic configured to control the magnitude of the DC voltage based on a reference current of the reference current circuit.

5. The current-mode DAC of claim 4, wherein:

the reference current circuit comprises a third transistor and a fourth transistor;

the third transistor is a scaled-down replica of the first transistor; and the fourth transistor is a scaled-down replica of the second transistor.

6. The current-mode DAC of claim 5, wherein the third transistor comprises a third gate terminal coupled to the first gate terminal, and the fourth transistor comprises a fourth gate terminal coupled to the digital input.

7. The current-mode DAC of claim 4, further comprising a comparator coupled to the reference current circuit, wherein the control logic controls the magnitude of the DC voltage based on an output of the comparator.

8. The current-mode DAC of claim 7, wherein inputs to the comparator comprise a reference voltage, and a signal based on the reference current.

9. A method of operating precision current source circuitry with tolerance to process, voltage, and temperature (PVT) variations, the method comprising:

receiving, at a first transistor comprising a first gate terminal, a digital input, wherein the first transistor drives an output current of the current source circuitry based on the digital input; and driving, using a second transistor comprising a second gate terminal, the output current based on:

a clock signal that is coupled to the second gate terminal via a coupling capacitor, and a DC voltage that is coupled to the second gate terminal via a coupling resistor, a magnitude of the DC voltage being set based on the PVT variations; wherein:

the output current flows through the first transistor and the second transistor.

10. The method of claim 9, further comprising removing, using the coupling capacitor, a direct current (DC) component of the clock signal and transmitting, to the second gate terminal, an alternating-current (AC) component of the clock signal.

11. The method of claim 9, further setting, using the coupling resistor, along with the coupling capacitor, a high-pass cutoff frequency for transmitting the clock signal.

12. The method of claim 9, further comprising:

controlling, using control logic, a magnitude of the DC voltage based on a reference current of a reference current circuit.

13. The method of claim 12, further comprising:

generating, using a third transistor and a fourth transistor of the reference current circuit, the reference current; wherein:

the third transistor is a scaled-down replica of the first transistor; and the fourth transistor is a scaled-down replica of the second transistor.

14. The method of claim 13, wherein the third transistor includes a third gate terminal and the fourth transistor includes a fourth gate terminal, the method further comprising:

coupling the third gate terminal to the first gate terminal; and coupling the fourth gate terminal to the digital input.

15. The method of claim 12, further comprising:

coupling a comparator to the reference current circuit; wherein:

controlling the magnitude of the DC voltage based on the reference current comprises controlling the magnitude of the DC voltage based on an output of the comparator.

16. The method of claim 15, further comprising providing, as inputs to the comparator, a reference voltage, and a signal based on the reference current.

17. Precision current source circuitry with tolerance to process, voltage, and temperature (PVT) variations, the current source circuitry comprising:

a first transistor comprising a first gate terminal configured to receive a digital input and to control magnitude of an output current based on the digital input; and a second transistor comprising a second gate terminal configured to receive:

a clock signal via a coupling capacitor, and a DC voltage via a coupling resistor, a magnitude of the DC voltage being set based on the PVT variations, the second transistor being configured to further control the magnitude of the output current based on the DC voltage; wherein:

the first transistor and the second transistor are coupled in series such that the output current flows through the first transistor and the second transistor.

18. The current source circuitry of claim 17, further comprising:

a reference current circuit; and control logic configured to control the magnitude of the DC voltage based on a reference current of the reference current circuit.

19. The current source of claim 18, further comprising a comparator coupled to the reference current circuit, wherein the control logic controls the DC voltage based on an output of the comparator.

20. The current source of claim 19, wherein inputs to the comparator comprise a reference voltage, and a signal based on the reference current.

21. A method of manufacturing a precision current-mode digital-to-analog converter (DAC) with tolerance to process, voltage, and temperature (PVT) variations, the method comprising:

arranging a first transistor and a second transistor in an output current flow path of the DAC;

arranging a first gate terminal of the first transistor to receive a digital input of the DAC, the digital input controlling magnitude of an output current in the output current flow path;

arranging a second gate terminal of the second transistor to receive a clock signal via a coupling capacitor, and arranging the second gate terminal of the second transistor to further receive, via a coupling resistor, a DC voltage having a magnitude to be set based on the PVT variations, the second transistor arranged such that the DC voltage further controls the magnitude of the output current.

* * * * *